United States Patent
Sakurai et al.

(10) Patent No.: US 8,059,689 B2
(45) Date of Patent: Nov. 15, 2011

(54) VERTICAL CAVITY SURFACE EMITTING LASER, VERTICAL CAVITY SURFACE EMITTING LASER DEVICE, OPTICAL TRANSMISSION DEVICE, AND INFORMATION PROCESSING APPARATUS

(75) Inventors: Jun Sakurai, Kanagawa (JP); Ryoji Ishii, Tokyo (JP); Hiromi Otoma, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/718,457

(22) Filed: Mar. 5, 2010

(65) Prior Publication Data

US 2011/0058587 A1   Mar. 10, 2011

(30) Foreign Application Priority Data

Sep. 8, 2009   (JP) .................. 2009-206557

(51) Int. Cl.
*H01S 5/00* (2006.01)
(52) U.S. Cl. ............. 372/46.01; 372/50.11; 372/50.124; 372/50.23
(58) Field of Classification Search ............... 372/46.01, 372/50.11, 50.124
See application file for complete search history.

(56) References Cited

U.S. PATENT DOCUMENTS

| 7,294,863 | B2 * | 11/2007 | Lee et al. ................... 257/98 |
| 2005/0271106 | A1 | 12/2005 | Watanabe et al. |
| 2009/0137076 | A1 | 5/2009 | Watanabe et al. |

FOREIGN PATENT DOCUMENTS

| JP | 2000-067449 | 3/2000 |
| JP | 2005-347604 | 12/2005 |
| JP | 2006-210429 | 8/2006 |

* cited by examiner

*Primary Examiner* — Dung Nguyen
(74) *Attorney, Agent, or Firm* — Fildes & Outland, P.C.

(57) ABSTRACT

A vertical cavity surface emitting laser that includes: a substrate; a first semiconductor multilayer reflector that is a first conductive type and formed on the substrate; an active region formed on the first semiconductor multilayer reflector; a second semiconductor multilayer reflector that is a second conductive type and formed on the active region; a current narrowing layer that is located between the first and second semiconductor multilayer reflectors, and in that a conductive region which has anisotropy in a long side direction and a short side direction within the surface which is parallel to a principal surface of the substrate is formed; and a convex lens member that is formed in a beam window which emits a light on the second multilayer reflector, and that has anisotropy in a long side direction and a short side direction within a surface which is parallel to the principal surface of the substrate.

6 Claims, 7 Drawing Sheets

CROSS-SECTION VIEW TAKEN FROM LINE A-A

CROSS-SECTION VIEW TAKEN FROM LINE B-B

WIDTH IN SHORT SIDE DIRECTION OF LENS
( 1 / CURVATURE RADIUS OF CROSS-SECTION SHAPE)

CROSS-SECTION VIEW TAKEN FROM LINE A-A

CROSS-SECTION VIEW TAKEN FROM LINE B-B

VERTICAL CAVITY SURFACE EMITTING LASER, VERTICAL CAVITY SURFACE EMITTING LASER DEVICE, OPTICAL TRANSMISSION DEVICE, AND INFORMATION PROCESSING APPARATUS

CROSS-REFERENCE TO RELATED APPLICATION

This application is based on and claims priority under 35 USC 119 from Japanese Patent Application No. 2009-206557 filed on Sep. 8, 2009.

BACKGROUND (i) Technical Field

The present invention relates to a vertical cavity surface emitting laser, a vertical cavity surface emitting laser device, an optical transmission device, and an information processing apparatus.

(ii) Related Art

A vertical cavity surface emitting laser (VCSEL) is used as a light source in a communication device and an image forming apparatus. In an exemplary selective oxidation type vertical cavity surface emitting laser, a current narrowing layer on which an oxidized aperture is formed by a selective oxidation process is located in a vertical resonator structure. The oxidized aperture has a function to narrow a current injected from an electrode, and inject a high density current to the inside of an active region. In addition, the oxidized aperture has a function to confine a light generated in the active region to a light emitting center with a refractive index difference between the inside and the outside of the oxidized aperture. Furthermore, the oxidized aperture controls a polarization plane of a laser beam to the long axis direction of the oxidized aperture by forming the planar shape of the oxidized aperture to an ellipsoidal shape in a substrate surface which is perpendicular to the optical axis.

SUMMARY

According to an aspect of the present invention, there is provided a vertical cavity surface emitting laser including: a substrate; a first semiconductor multilayer reflector that is a first conductive type and formed on the substrate; an active region formed on the first semiconductor multilayer reflector; a second semiconductor multilayer reflector that is a second conductive type and formed on the active region; a current narrowing layer that is located between the first and second semiconductor multilayer reflectors, and in that a conductive region which has anisotropy in a long side direction and a short side direction within the surface which is parallel to a principal surface of the substrate is formed; and a convex lens member that is formed in a beam window which emits a light on the second multilayer reflector, and that has anisotropy in a long side direction and a short side direction within a surface which is parallel to the principal surface of the substrate.

BRIEF DESCRIPTION OF THE DRAWINGS

Exemplary embodiments of the present invention will be described in detail based on the following figures, wherein.

DETAILED DESCRIPTION

A description will now be given, with reference to the accompanying drawings, of exemplary embodiments of the present invention. In the following description, a selective oxidation type vertical cavity surface emitting laser will be exemplified, and the vertical cavity surface emitting laser is abbreviated as the VCSEL. The scale in drawings is exaggerated to understand the feature of the present invention, and is not same as the scale of actual devices.

First Exemplary Embodiment

Figure 1A:
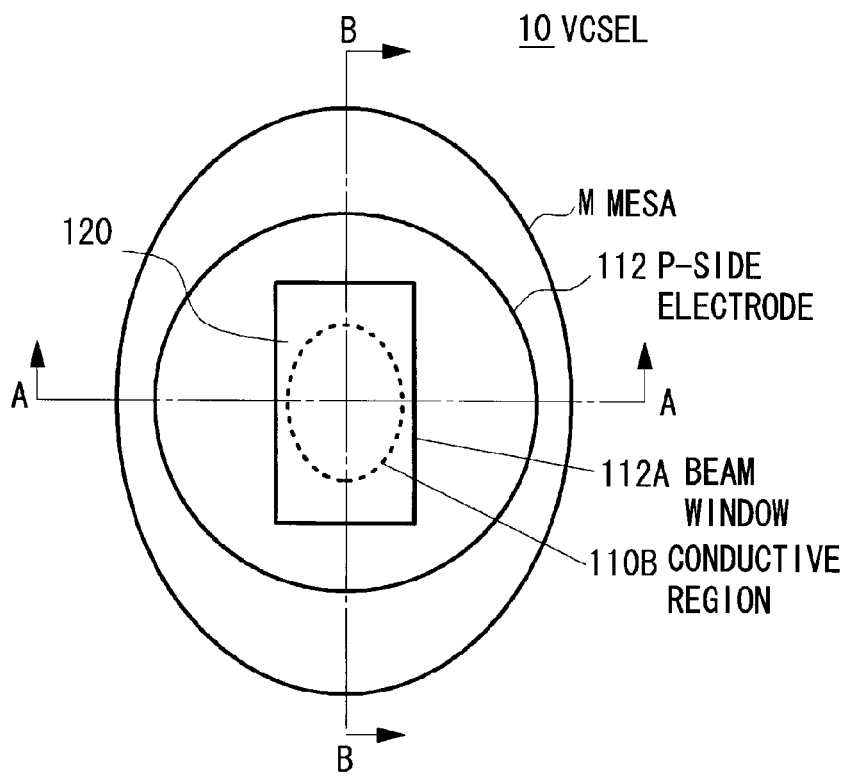
FIG. 1A is a schematic plan view.
Figure 1B:
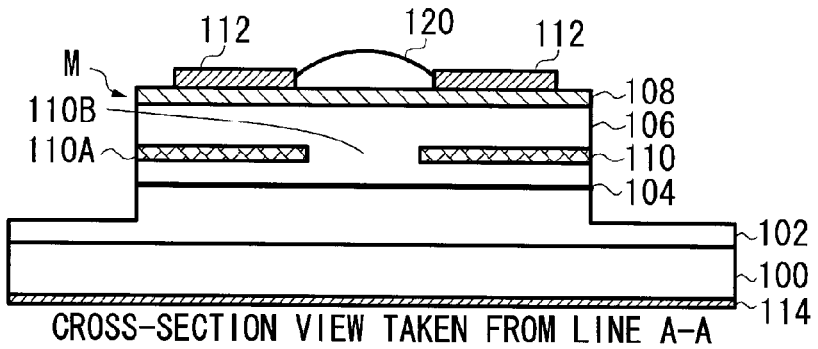
FIG. 1B is a cross-section view taken from line A-A.
Figure 1C:
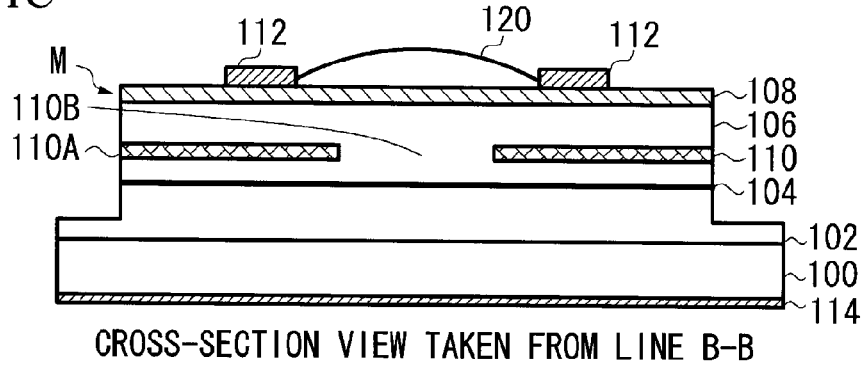
FIG. 1C is a cross-section view taken from line B-B of a vertical cavity surface emitting laser in accordance with a first exemplary embodiment of the present invention.

FIG. 1A is a schematic plan view, FIG. 1B is a cross-section view taken from line A-A, and FIG. 1C is a cross-section view taken from line B-B of a VCSEL in accordance with the first exemplary embodiment of the present invention. A VCSEL 10 of the exemplary embodiment is formed by stacking an n-type distributed Bragg reflector (hereinafter, abbreviated as DBR) 102, an active region 104, and a p-type upper DBR 106 on an n-type GaAs substrate 100. The n-type DBR 102 is formed by stacking AlGaAs layers with different Al composition alternately. The active region 104 includes a quantum well layer sandwiched between upper and lower spacer layers. The p-type upper DBR 106 is formed by stacking AlGaAs layers with different Al composition on the active region 104 alternately. A contact layer 108 composed of p-type GaAs is formed on the top layer of the upper DBR 106, and a current narrowing layer 110 composed of p-type AlAs is formed on the bottom layer of the upper DBR 106 or inside of the bottom layer of the upper DBR 106.

A mesa (a columnar structure) M is formed on the substrate 100 by etching a semiconductor layer from the upper DBR 106 to the lower DBR 102. Preferably, the mesa M has an ellipsoidal shape that has a long axis and a short axis within a surface which is parallel to the principal surface of the substrate 100. The current narrowing layer 110 is exposed on the lateral side of the mesa M, and has an oxidization region 110A which is selectively oxidized from the lateral side, and a conductive region (an oxidized aperture) 110B surrounded by the oxidization region 110A. In the oxidization process of the VCSEL, the oxidation rate of an AlAs layer is faster than that of an AlGaAs layer. Since the current narrowing layer 110 is oxidized from the lateral side of the mesa M to the inside at an almost constant rate, the planar shape of the surface, which is parallel to the principal surface of the substrate 100, of the conductive region 110B becomes an ellipsoidal shape which reflects the shape of the mesa M. The long axis and the short axis of the ellipsoidal shape correspond to the long axis and the short axis of the mesa M. Therefore, the center of the conductive region 110B (the intersection point of the long axis with the short axis within the surface which is parallel to the principal surface of the substrate) corresponds to the center of the mesa M (the intersection point of the long axis with the short axis within the surface which is parallel to the principal surface of the substrate), and these centers become the optical axis of the VCSEL 10.

A p-side electrode 112 such as Au/Pt/Ti or Au/Ti is formed on the contact layer 108, and is ohmic connected to the contact layer 108. A rectangular opening 112A is formed in the p-side electrode 112, the long side direction and short side direction of the opening 112A correspond to the long axis direction and short axis direction of the mesa M, and the intersection point of diagonal lines of the opening 112A is substantially on the optical axis. This opening 112A becomes a beam window from which the laser beam is emitted. An n-side electrode 114 is formed on the back side of the substrate 100.

A feature of the exemplary embodiment is a convex lens 120 which is formed in the beam window 112A of the p-side electrode 112, and substantially rounded in whole. Preferably, the lens 120 is formed by hardening liquid resin, which is spherically-shaped in whole by surface tension, by a thermal process or an ultraviolet irradiation after applying liquid resin in the beam window 112A by a method such as the ink-jet method. Acrylic resin or epoxy resin can be used as liquid resin, and a variation can be suppressed by using epoxy resin of which the volume contraction is low.

Figure 2A:
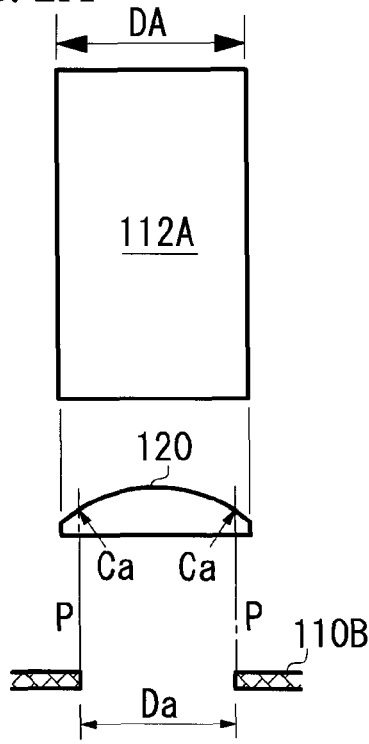
FIG. 2A is a diagram illustrating a lens curvature in a short axis direction.
Figure 2B:
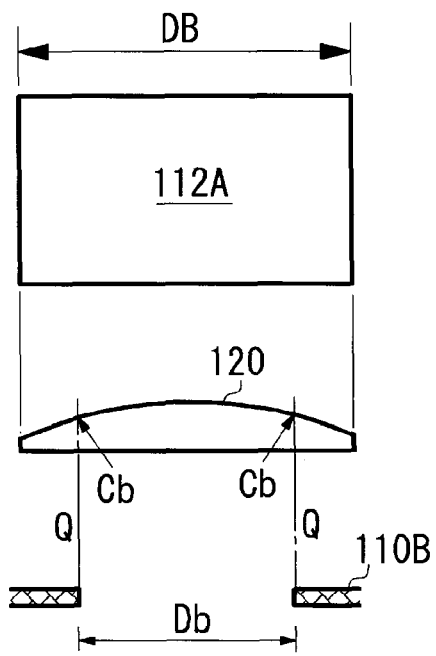
FIG. 2B is a diagram illustrating a lens curvature in a long axis direction.

FIG. 2A is a diagram illustrating a lens curvature in the short axis direction (line A-A direction in FIG. 1A), and FIG. 2B is a diagram illustrating a lens curvature in the long axis direction (line B-B direction in FIG. 1A). The planar shape of the beam window 112A is a rectangle of which the width in the long side direction is different from the width in the short side direction. The width in the short side direction is indicated with DA, and the width in the long side direction is indicated with DB. Under the assumption that the width in the short axis direction of the conductive region 110B is Da and the width in the long axis direction is Db, DA is greater than Da (DA>Da) and DB is greater than Db (DB>Db). Since liquid resin applied to the beam window 112A has a surface tension with a relation of DA<DB, the optical power in the short side direction of the lens 120 becomes greater than that in the long side direction of the lens 120. More specifically, the curvature in the short side direction of the lens 120 becomes larger than that in the long side direction.

In FIG. 2A, when a curvature Ca (1/a curvature radius) at the intersection point of a line P which is an extension of a marginal portion in the short axis direction of the conductive region 110B to the optical axis direction with the surface of the lens 120 is compared to a curvature Cb (1/a curvature radius) at the intersection point of a line Q which is an extension of a marginal portion in the long axis direction of the conductive region 110 with the surface of the lens 120, Ca is greater than Cb (Ca>Cb).

Figure 2C:
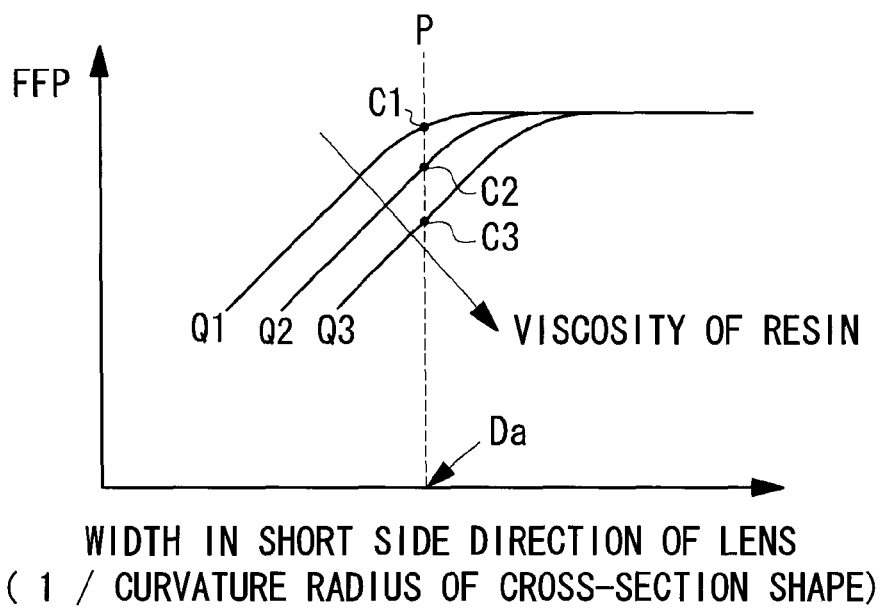
FIG. 2C illustrates a relation between FFP and a lens width in the short axis direction.

As illustrated in FIG. 2C, the curvature Ca of the lens 120 can be controlled by the width in the short side direction of the lens (the width DA of the beam window 112A) and/or the viscosity of resin which composes the lens. The vertical axis in FIG. 2C indicates the direction of FFP (optical axis), and the horizontal axis indicates the width in the short side direction of the lens (or the width DA of the beam window). When the viscosity of resin composing the lens gets higher in order of Q1, Q2, and Q3, the curvature Ca when the line P intersects with the lens 120 can be changed as C1, C2 and C3. Although same resin is used, if the width in the short side direction of the lens is different, in other words, if the difference with the width Da of the conductive region is different, the curvature Ca when the line P intersects with the lens 120 can be changed. Therefore, the desirable curvature Ca of the lens 120 can be obtained by selecting the proper values of the resin viscosity and the difference between the width Da and the width DA.

Figure 3:
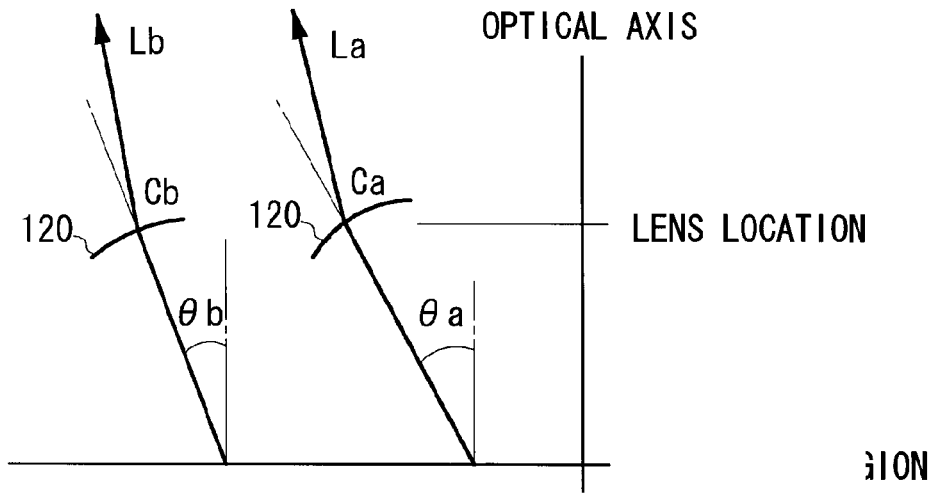
FIG. 3 is a diagram illustrating a control of a spread angle in accordance with the first exemplary embodiment.

The lower DBR 102 and the upper DBR 106 construct a vertical resonator on the substrate. When a forward drive current is applied between the p-side electrode 112 and the n-side electrode 114, a light generated in the active region 104 is amplified in the vertical resonator, and a laser beam with single lateral mode is emitted from the beam window 112A. The polarization of the laser beam is controlled to mainly the long axis direction with the conductive region 110B having an ellipsoidal shape. The spread angle of the laser beam is larger in the short axis direction than that in the long axis direction of the conductive region 110B. However, since the curvature in the short axis direction of the lens 120 becomes larger than that in the long axis direction, the spread angle in the short axis direction is suppressed. As illustrated in FIG. 3, under the assumption that the spread angle of the laser beam La in the short axis direction of the conductive region 110B is θa, and the spread angle of the laser beam Lb in the long axis direction is θb (θa>θb), the laser beam La is refracted to the optical axis side by the curvature Ca of the lens 120, and the degree of this refraction is greater than that of a refraction of when the laser beam Lb is refracted to the optical axis side by the curvature Cb of the lens 120. Therefore, the difference between the spread angles of the laser beams La and Lb that are emitted from the VCSEL 10 becomes small. As a result, the spread angle comes to a circle in a two dimensional view, and the shape of the beam comes to a true circle. As described above, according to the first exemplary embodiment, the control of the polarization of the laser beam of the VCSEL and the control of the spread angle can be performed simultaneously and independently.

Figure 4:
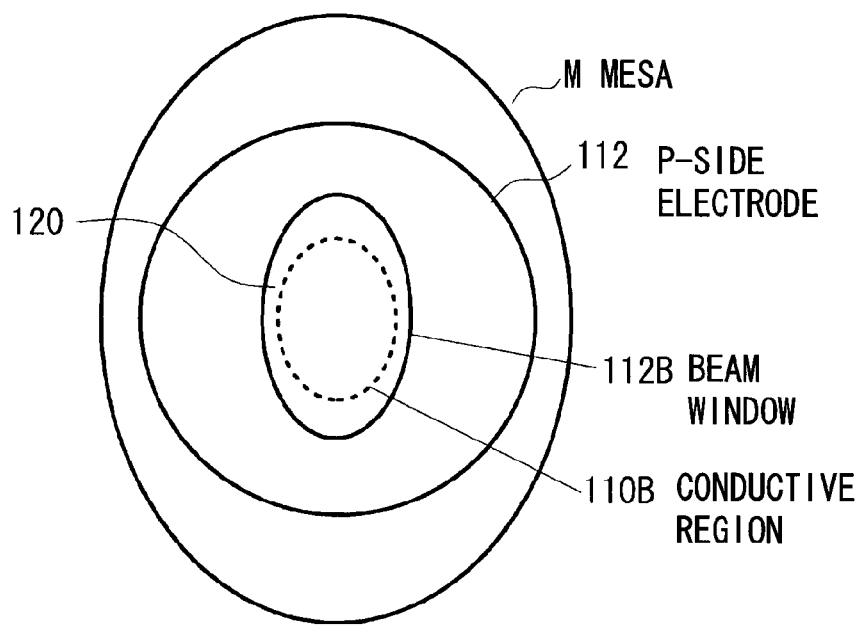
FIG. 4 is a schematic plan view of a vertical cavity surface emitting laser illustrating a variant exemplary embodiment of the first exemplary embodiment.

FIG. 4 is a plan view illustrating a variant exemplary embodiment of the first exemplary embodiment. In the first exemplary embodiment illustrated in FIG. 1A, a beam window 112B of the p-side electrode 112 is a rectangle, but in this variant exemplary embodiment, the planar shape of the beam window 112B is an ellipsoidal shape as another shape with anisotropy. The long axis and short axis of the beam window 112B substantially correspond to the long axes and short axes of the mesa M and the conductive region 110B respectively. The Variation of the lens curvature from the long axis to the short axis can be smoother by making the beam window 112B have an ellipsoidal shape.

Second Exemplary Embodiment

Figure 5A:
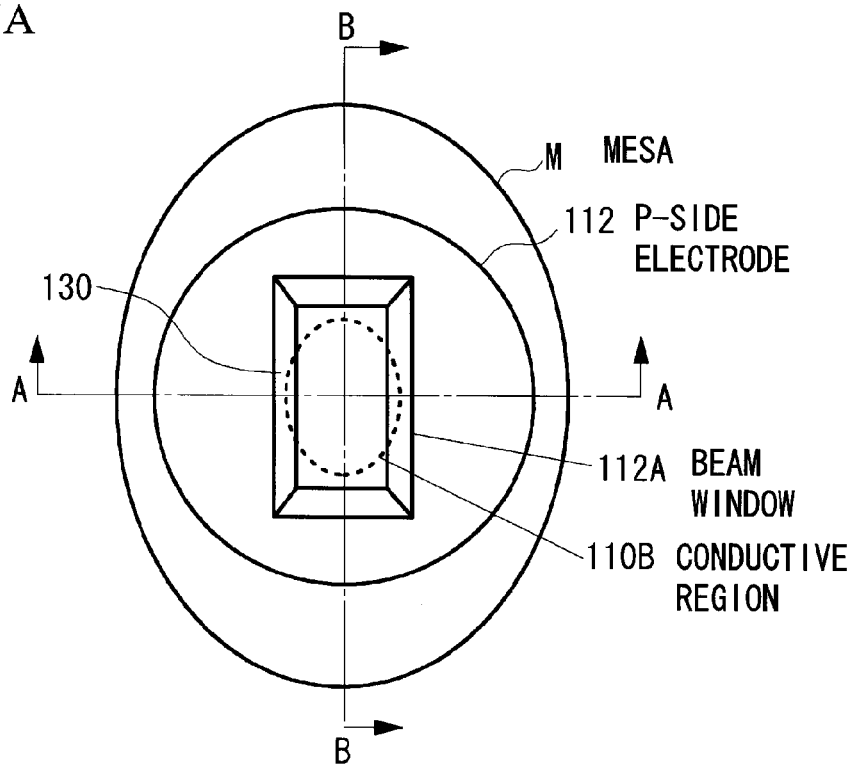
FIG. 5A is a schematic plan view.
Figure 5B:
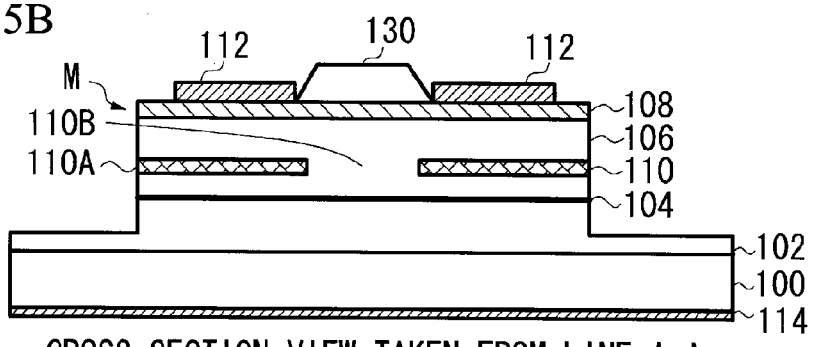
FIG. 5B is a cross-section view taken from line A-A.
Figure 5C:
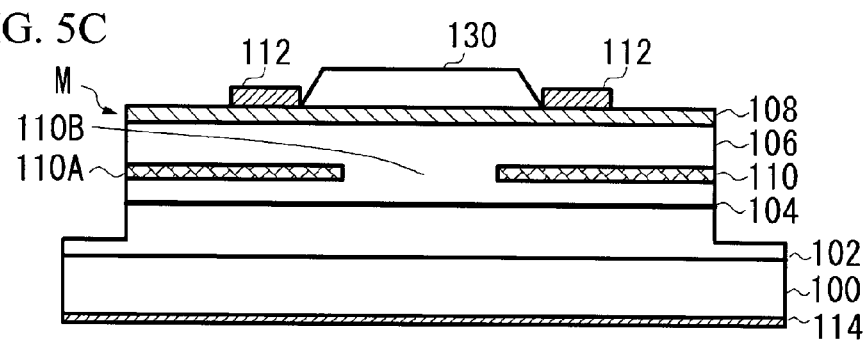
FIG. 5C is a cross-section view taken from line B-B of a vertical cavity surface emitting laser in accordance with a second exemplary embodiment of the present invention.
Figure 6A:
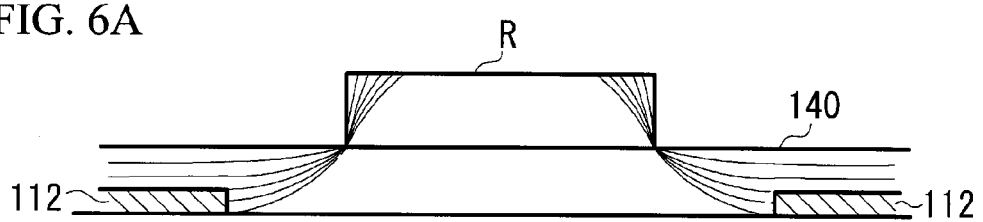
FIGS. 6A and 6B are diagrams illustrating a fabrication method of a lens in accordance with the second exemplary embodiment.
Figure 6B:
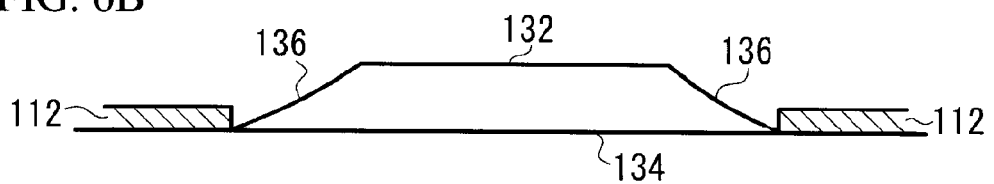

Now the second exemplary embodiment will be described. FIG. 5A is a schematic plan view, FIG. 5B is a cross-section view taken from line A-A, and FIG. 5C is a cross-section view taken from line B-B of a VCSEL in accordance with the second exemplary embodiment. Same reference numerals are used for the same components as in FIGS. 1A through 1C. The lens composition in the second exemplary embodiment is different from the one in the first exemplary embodiment. A lens 130 in accordance with the second exemplary embodiment has a rectangular shape of which the cross section is in a trapezoidal shape. This lens 130 includes a flat top surface 132, a flat bottom surface 134 which faces the top surface 132, four lateral surfaces 136 which connects the top surface 132 to the bottom surface 134 as illustrated in FIG. 6B. Lateral surfaces 136 incline in a linear or curvilinear fashion, and this inclination acts as a surface which refracts a laser beam as described later.

The lens 130 is composed of an insulation film such as SiN, preferably. As illustrated in FIG. 6A, a resist pattern R is formed so as to cover a region where the lens 130 is formed, after forming patterns of the p-side electrode 112 on the contact layer 108, and forming an SiN film 40 with constant film thickness so as to cover these. Then, the SiN film 140 is dry etched with $SF_6$ and $O_2$ for a given length of time by using the resist pattern R as a mask. The sidewall of the resist pattern R is etched so as to back away gradually by the dry etching. Accordingly, the sidewall of the SiN film 140 is etched so as to have a taper shape, and the lens 130 where the taper is formed on the side wall can be obtained finally, as illustrated in FIG. 6B.

Figure 7A:
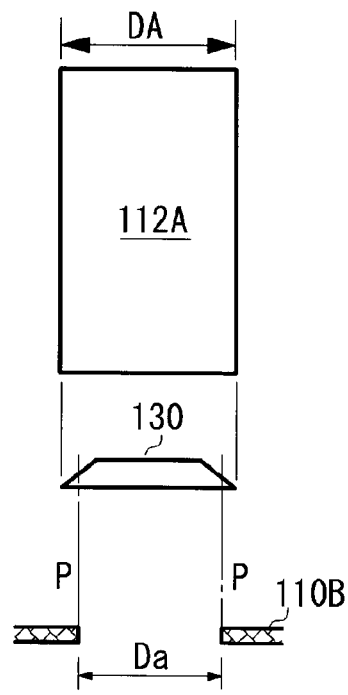
FIGS. 7A and 7B are diagrams illustrating lens curvatures in the short axis direction and in the long axis direction in the second exemplary embodiment.
Figure 7B:
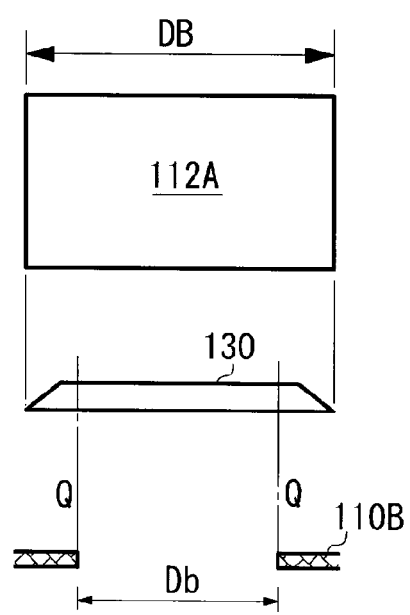

FIGS. 7A and 7B are diagrams illustrating the control of spread angles of the laser beam in the short side direction and the long side direction. As illustrated in FIG. 7A, the width in the short side direction of the lens 130 substantially corresponds to the width DA in the short side direction of the beam window 112A. The line P which is an extension of the marginal portion in the short axis direction of the conductive region 110B to the optical axis direction intersects with the taper-shaped lateral surface 136 of the lens 130. On the other hand, as illustrated in FIG. 7B, the width in the long side direction of the lens 130 substantially corresponds to the width DB in the long side direction of the beam window 112A. The line Q which is an extension of the marginal portion in the long axis direction of the conductive region 110B to the optical axis direction intersects with the flat top surface 132 of the lens 130.

Figure 8:
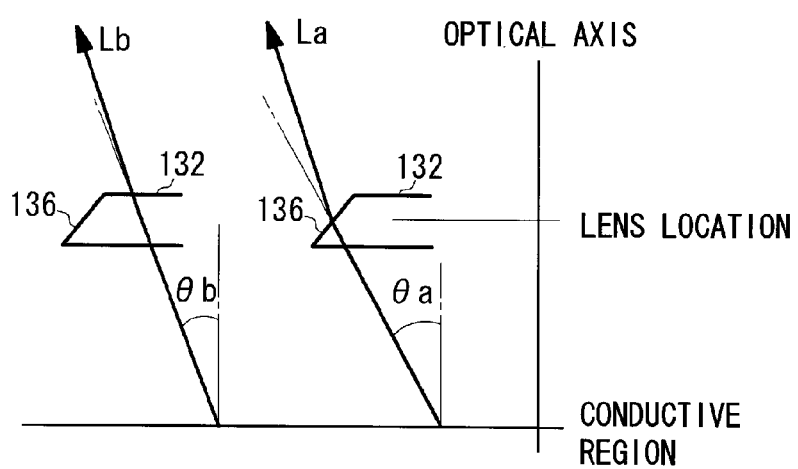
FIG. 8 is a diagram illustrating a control of a spread angle in the second exemplary embodiment.

As illustrated in FIG. 8, under the assumption that the spread angle of the laser beam La in the short axis direction of the conductive region 110B is θa, and the spread angle of the laser beam Lb in the long axis direction is θb (θa>θb), the laser beam La in the short axis direction is refracted to the optical axis side by entering to the taper-shaped lateral surface 136 of the lens 130, and is controlled so that its spread angle θa becomes small. On the other hand, since the laser beam Lb in the long axis direction enters to the flat top surface 132 of the lens 130, its spread angle θb stays about the same. Accordingly, the difference between the spread angles of the laser beams La and Lb becomes small, and the beam shape comes to a true circle. According to the second exemplary embodiment, the lens 130 can be fabricated reproducibly and with a high degree of accuracy by using the semiconductor process.

Now preferable compositions and a fabrication process of the VCSEL described in the first and second exemplary embodiments are exemplified. The VCSEL is fabricated by the metal organic chemical vapor deposition (MOCVD) method. The VCSEL is formed by stacking the n-type lower DBR 102, an undoped lower $Al_{0.6}Ga_{0.4}As$ spacer layer, the undoped quantum well active region 104, and the p-type upper DBR 106 on the n-type GaAs substrate 100. The n-type DBR 102 is composed by stacking $Al_{0.9}Ga_{0.1}As$ and $Al_{0.12}Ga_{0.88}As$ with a carrier concentration of $2\times10^{18}$ $cm^{-3}$ alternately 40.5 periods so that each film thickness becomes a quarter of the wavelength in the medium. The undoped quantum well active region 104 is an active region composed of three GaAs quantum well layers with a film thickness of 70 nm, four $Al_{0.3}Ga_{0.7}As$ barrier layers with a film thickness of 50 nm, and an undoped upper $Al_{0.6}Ga_{0.4}As$ spacer layer. The p-type upper DBR 106 is composed by stacking p-type $Al_{0.9}Ga_{0.1}As$ and p-type $Al_{0.12}Ga_{0.88}As$ with a carrier concentration of $2\times10^{18}$ $cm^{-3}$ alternately 30 periods so that each film thickness becomes a quarter of the wavelength in the medium. The current narrowing layer 110 composed of p-type AlAs is inserted into the upper DBR 106 near the active region 104, and the p-type GaAs contact layer 108 with a carrier concentration of $1\times10^{19}$ $cm^{-3}$ is formed on the top layer of the upper DBR 106.

Then, the semiconductor layer on the substrate is etched by the photolithography process conventionally known, and the mesa M having an ellipsoidal shape is formed on the substrate. The oxidization region 110A and the conductive region 110B surrounded by the oxidization region 110A are formed in the current narrowing layer 110 by the oxidization process. The radius in the long axis direction of the conductive region 110B is set to be equal to or less than 4 µm for example, which achieves single mode.

The circular p-side electrode 112 is formed on the upper DBR 106 by the liftoff process. The p-side electrode 112 may be formed on the contact layer 108 before the mesa M is formed. Then, the lens 120 is formed in the beam window 112A of the p-side electrode 112. In the second exemplary embodiment, the SiN film 140 is formed on whole surface of the substrate including a mesa. After that, the SiN film 140 is etched, and the lens 130 is formed in the beam window 112A. The VCSEL illustrated in FIGS. 1 and 5 can be obtained by forming the n-side electrode 114 on the back side of the substrate.

The mesa M has an ellipsoidal shape in above exemplary embodiments, but the mesa M can have other shapes with anisotropy such as a rectangle of which widths in the long side direction and the short side direction are different or a diamond shape, besides an ellipsoidal shape. Furthermore, the lens 130 is composed of the SiN film in the second exemplary embodiment, but can be composed of other insulation films which have optical transparency such as SiON. In above exemplary embodiments, the description is given of an AlGaAs-based VCSEL, but the VCSEL can be other VCSELs using other III-V group compound semiconductors. In above exemplary embodiments, the description is given of a single spot VCSEL, but the VCSEL can be a multi-spot VCSEL where multiple mesas (emission portion) are formed on the substrate, or a VCSEL array.

Figure 9A:
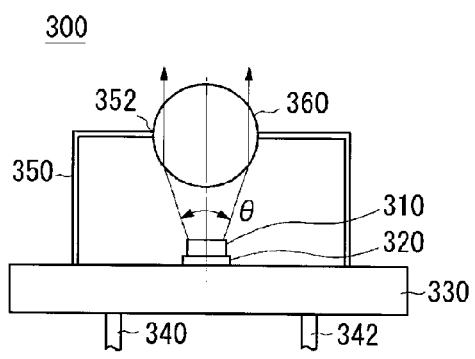
FIGS. 9A and 9B are schematic cross-section views illustrating a composition of a vertical cavity surface emitting laser device in which a VCSEL and an optical component are packaged.

Now a description will be given of a vertical cavity surface emitting laser device, an optical information processing apparatus, and an optical transmission device using the VCSEL of exemplary embodiments with reference to drawings. FIG. 9A is a cross-section view illustrating the composition of a vertical cavity surface emitting laser device in which the VCSEL and an optical component are packaged. A vertical cavity surface emitting laser device 300 fixes a chip 310, on which the VCSEL is formed, to a disk-shaped metal stem 330 via a conductive bond 320. Conductive leads 340 and 342 are inserted in a through hole (not illustrated) provided to the stem 330, the lead 340 is electrically connected to an n-side electrode of the VCSEL, and the lead 342 is electrically connected to a p-side electrode.

A rectangular hollow cap 350 is fixed on the stem 330 including the chip 310, and a ball lens 360 is fixed in an opening 352 located in the center of the cap 350. The ball lens 360 is laid out so that the optical axis of the ball lens 360 corresponds to the substantial center of the chip 310. When a forward current is applied between leads 340 and 342, a laser beam is emitted from the chip 310 to the vertical direction. The distance between the chip 310 and the ball lens 360 is adjusted so that the ball lens 360 is included within the spread angle θ of the laser beam from the chip 310. A light receiving element and a temperature sensor to monitor the emitting condition of the VCSEL can be included in the cap.

Figure 9B:
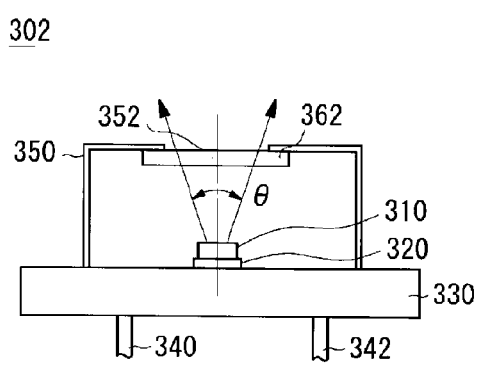

FIG. 9B is a diagram illustrating a composition of another vertical cavity surface emitting laser device. A vertical cavity surface emitting laser device 302 illustrated in FIG. 9B fixes a plane glass 362 in the opening 352 located in the center of the cap 350 instead of using the ball lens 360. The plane glass 362 is laid out so that the center of the plane glass 362 corresponds to the substantial center of the chip 310. The distance between the chip 310 and the plane glass 362 is adjusted so that the opening radius of the plane glass 362 becomes equal to or larger than the spread angle θ of the laser beam from the chip 310.

Figure 10:
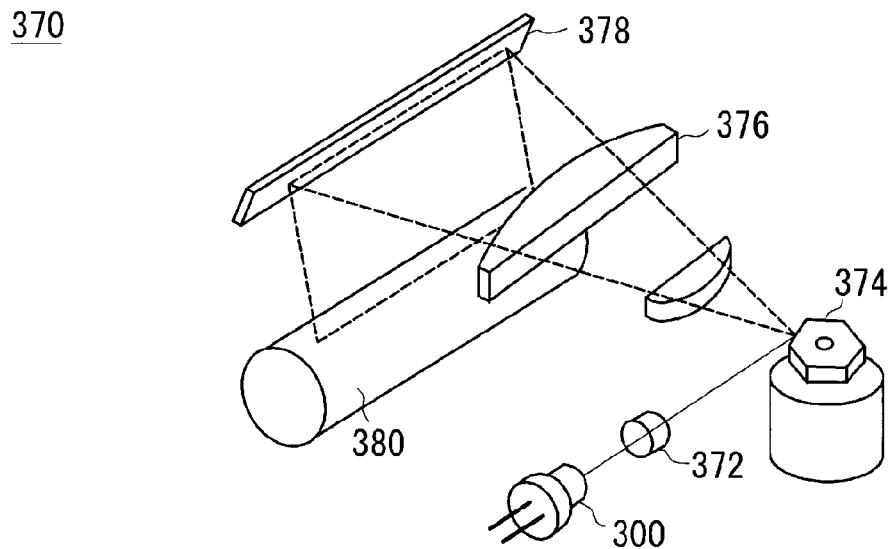
FIG. 10 is a diagram illustrating a composition of a light source device using the vertical cavity surface emitting laser of exemplary embodiments.

FIG. 10 is a diagram illustrating a case where the VCSEL is applied to a light source of an optical information processing apparatus. An optical information processing apparatus 370 is provided with a collimator lens 372 which receives the laser beam from the vertical cavity surface emitting laser device 300 or 302, in which the VCSEL is packaged, illustrated in FIGS. 9A and 9B, a polygon mirror 374 which rotates at constant speed and reflects a beam of light from the collimator lens 372 at constant spread angle, an fθ lens 376 which receives the laser beam from the polygon mirror 374 and irradiates the laser beam to a reflection mirror 378, the linear reflection mirror 378, and a photoreceptor drum (a record medium) 380 which forms latent images based on the reflection beam from the reflection mirror 378. As described above, the laser beam from the VCSEL can be used as a light source of the optical information processing apparatus such as a copier and a printer provided with an optical system which focuses the laser beam from the VCSEL onto the photoreceptor drum and a structure which scans the focused laser beam on the photoreceptor drum.

Figure 11:
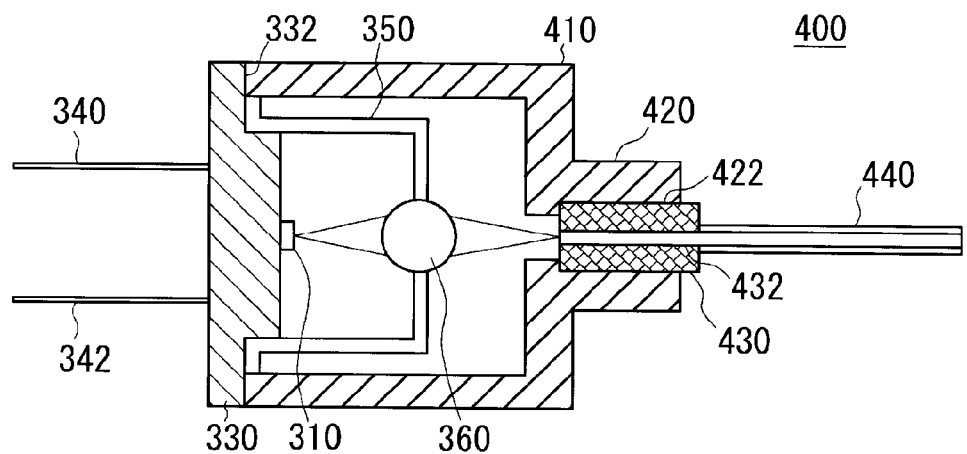
FIG. 11 is a schematic cross-section view illustrating a composition of an optical transmission device using the vertical cavity surface emitting laser device illustrated in FIGS. 9A and 9B.

FIG. 11 is a cross section view illustrating a composition where the vertical cavity surface emitting laser device illustrated in FIG. 9A is applied to an optical transmission device. An optical transmission device 400 includes a cylindrical chassis 410 fixed to the stem 330, a sleeve 420 integrally-formed on the end surface of the chassis 410, a ferrule 430 held in an opening 422 of the sleeve 420, and an optical fiber 440 held by the ferrule 430. The end portion of the chassis 410 is fixed to a flange 332 which is circumferentially-formed of the stem 330. The ferrule 430 is laid out in the opening 422 of the sleeve 420 accurately, and the optical axis of the optical fiber 440 is matched to the optical axis of the ball lens 360. The core of the optical fiber 440 is held in a through hole 432 of the ferrule 430

The laser beam emitted from the surface of the chip 310 is focused by the ball lens 360. The focused beam enters to the core of the optical fiber 440, and is transmitted. In the above embodiments, the ball lens 360 is used, but other lenses such as a biconvex lens and a plane-convex lens can be used besides a ball lens. Furthermore, the optical transmission device 400 can include a drive circuit to apply an electrical signal to leads 340 and 342. The optical transmission device 400 can also include a receiving function to receive an optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A vertical cavity surface emitting laser comprising:

a substrate;

a first semiconductor multilayer reflector that is a first conductive type and formed on the substrate;

an active region formed on the first semiconductor multilayer reflector;

a second semiconductor multilayer reflector that is a second conductive type and formed on the active region;

a current narrowing layer that is located between the first and second semiconductor multilayer reflectors, and in that a conductive region which has anisotropy in a long side direction and a short side direction within the surface which is parallel to a principal surface of the substrate is formed; and a convex lens member that is formed in a beam window which emits a light on the second multilayer reflector, and that has anisotropy in a long side direction and a short side direction within a surface which is parallel to the principal surface of the substrate;

the long side direction and the short side direction of the conductive region corresponding to the long side direction and the short side direction of the convex lens member respectively, and the curvature in the short side direction of the convex lens member being larger than the curvature in the long side direction.

2. The vertical cavity surface emitting laser according to claim 1, wherein a curvature in the long side direction of the convex lens member is different from a curvature in the short side direction.

3. The vertical cavity surface emitting laser according to claim 1, wherein an electrode which is electrically connected to the second semiconductor multilayer reflector is formed on the second semiconductor multilayer reflector, and the beam window which has anisotropy in the long side direction and the short side direction within the surface which is parallel to the principal surface of the substrate is formed to the electrode.

4. The vertical cavity surface emitting laser according to claim 1, wherein the convex lens member is formed by putting drops of liquid resin in the beam window.

5. The vertical cavity surface emitting laser according to claim 1, wherein the convex lens member is an insulation film with optical transparency, and has an inclined lateral surface and a top surface which is coupled to the inclined lateral surface.

6. The vertical cavity surface emitting laser according to claim 5, wherein the width in the long side direction of the conductive region of the current narrowing layer is smaller than the width in the long side direction of the convex lens member;

the width in the short side direction of the conductive region is smaller than the width in the short side of the convex lens member;

the line which is an extension of the marginal portion in the long side direction of the conductive region to the optical axis direction intersects with a flat top surface of the convex lens member; and the line which is an extension of the marginal portion in the short side direction of the conductive region intersects with a lateral surface of the convex lens member.

* * * * *